United States Patent
Osenbach

(10) Patent No.: US 8,502,372 B2
(45) Date of Patent: Aug. 6, 2013

(54) LOW-COST 3D FACE-TO-FACE OUT ASSEMBLY

(75) Inventor: John Osenbach, Kutztown, PA (US)

(73) Assignee: LSI Corporation, Milpitas, CA (US)

( * ) Notice: Subject to any disclaimer, the term of this patent is extended or adjusted under 35 U.S.C. 154(b) by 1 day.

(21) Appl. No.: 13/217,857

(22) Filed: Aug. 25, 2011

(65) Prior Publication Data

US 2012/0049353 A1    Mar. 1, 2012

Related U.S. Application Data

(60) Provisional application No. 61/377,171, filed on Aug. 26, 2010.

(51) Int. Cl.
*H01L 23/10* (2006.01)
*H01L 21/00* (2006.01)

(52) U.S. Cl.
USPC .............................. 257/704; 257/710; 438/10

(58) Field of Classification Search
USPC ..................... 257/E23.004, E23.043–E23.05, 257/E23.005–E23.009, E23.041, E23.053, 257/E23.055, 678–733, 787–796, 666–677
See application file for complete search history.

(56) References Cited

U.S. PATENT DOCUMENTS

| | | | | |
|---|---|---|---|---|
| 6,423,570 B1 * | 7/2002 | Ma et al. | | 438/106 |
| 6,507,098 B1 * | 1/2003 | Lo et al. | | 257/686 |
| 6,709,898 B1 * | 3/2004 | Ma et al. | | 438/122 |
| 7,564,124 B2 * | 7/2009 | Lee et al. | | 257/675 |
| 7,642,128 B1 | 1/2010 | Lin et al. | | |
| 7,927,919 B1 | 4/2011 | Fan et al. | | |
| 7,939,375 B2 | 5/2011 | Lin et al. | | |
| 7,939,920 B2 | 5/2011 | Wallace | | |
| 7,944,039 B2 | 5/2011 | Arai | | |
| 2003/0157747 A1 * | 8/2003 | Chen et al. | | 438/106 |
| 2010/0059855 A1 | 3/2010 | Lin et al. | | |
| 2010/0148360 A1 | 6/2010 | Lin et al. | | |
| 2010/0246152 A1 | 9/2010 | Lin et al. | | |
| 2010/0320582 A1 | 12/2010 | Pagaila et al. | | |
| 2011/0074015 A1 | 3/2011 | Suzuki | | |
| 2011/0103121 A1 | 5/2011 | Osakabe | | |

OTHER PUBLICATIONS

Keser, Beth, et al., "The Redistributed Chip Package: A Breakthrough for Advanced Packaging", 2007 Electronic Components and Technology Conference (2007 IEEE); pp. 286-291.

Bernstein, K, et al., "Interconnects in the Third Dimension: Design Challenges for 3D ICs—Abstract only", IEEE Xplore, Jun. 8, 2011, http://ieexplore.ieee.org/xpls/abs_all.jsp?arnumber=4261246, 1 page.

(Continued)

*Primary Examiner* — Julio J Maldonado
*Assistant Examiner* — Moin Rahman
(74) *Attorney, Agent, or Firm* — Hitt Gaines, P.C.

(57) ABSTRACT

An electronic device includes first and second electronic device dice. The first electronic device die is embedded within a resin layer. A dielectric layer is located over the device die and the resin layer. First interconnects within the dielectric layer connect a first subset of electrical contacts on the first electronic device to corresponding terminals at a surface of the dielectric that are located over the first electronic device. Second interconnects within the dielectric layer connect a second subset of electrical contacts on the first electronic device to corresponding bump pads at a surface of the dielectric that are located over the resin layer.

20 Claims, 11 Drawing Sheets

OTHER PUBLICATIONS

Van Der Plas, G, et al., "Design Issues and Considerations for Low-Cost 3-D TSV IC Technology—Abstract only", IEEE Xplore http://ieexplore.ieee.org/xpls/abs_all.jsp?arnumber=5604678, Jun. 8, 2011, 3 pages.

Wei, Xiaojin, et al., "Stacked Microchannel Heat Sinks for Liquid Cooling of Microelectronic Components", J. Electron. Packag., Mar. 2004, vol. 126, Issue 1, 60 (Abstract only); 2 pages.

Micronews, "Amkor Readying Fan Out WLP Technology", Advanced Packaging: 3D IC, WLP & TSV: Amkor Readying Fan Out WLP Technology, http://www.i-micronews.com/lectureArticle.asp?id=6058 (Mar. 25, 2011); 3 pages.

Freescale Semiconductor, Redistributed Chip Package (RCP) Technology, 2006, 6 pages.

Pak, Jun So, et al., "Electrical Characterization of Trough Silicon via (TSV) depending on Structural and Material Parameters based on 3D Full Wave Simulation", Nov. 19-22, 2007, 6 pages.

Lim, Sung Kyu, "TSV-Aware 3D Physical Design Tool Needs for Faster Mainstream Acceptance of ED ICs", Design Automation Conference, 2010, 11 pages.

Katti, G, et al.; "3D stacked ICs using Cu TSVs and Die to Wafer Hybrid Collective bonding", 2009 IEEE, pp. 14.41-14.4.4.

Kurino, H., et al.; "Intelligent Image Sensor Chip with Three Dimensional Structure", 1999 IEEE, pp. 36.4.1-36.4.4.

Walker, Jim, "TSV—First or Last, Fact or Fiction, Now or Future?", VP Research Semiconductor Manufacturing, Gartner-Dataquest, Sep. 10, 2008, 22 pages.

Yoon, Seung Wook, et al., "3D eWLB (embedded wafer level BGA) technology for 3D-packaging/3D-packaging/3D-SIP (Systems-in-Package) application", IEEE Explore http://ieexplore.ieee.org/xpls/abs_all.jsp?arnumber=5416412, (Abstract only); 1 page.

* cited by examiner

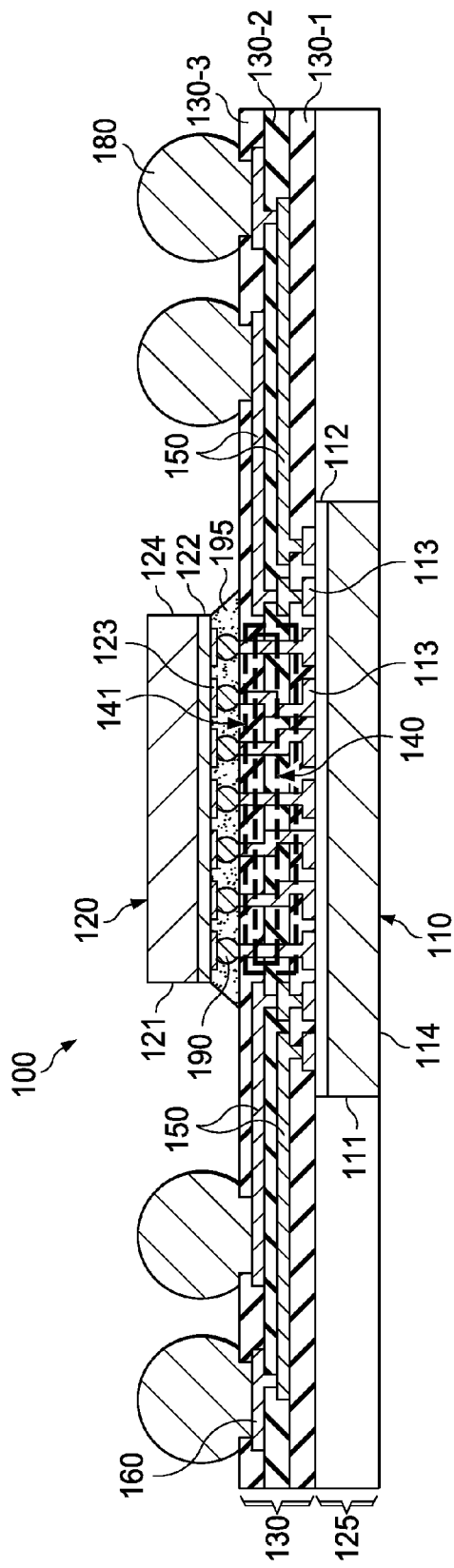
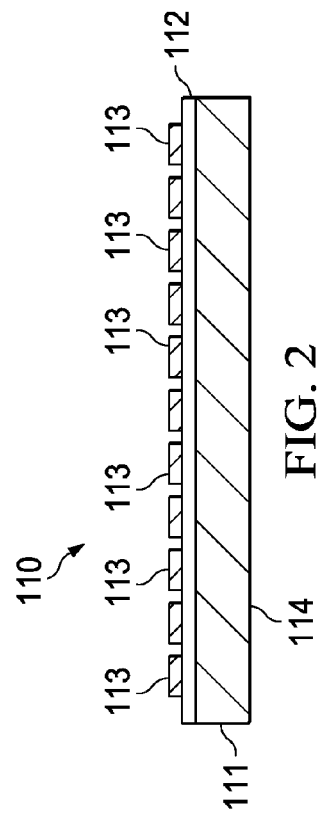
FIG. 1A
FIG. 2

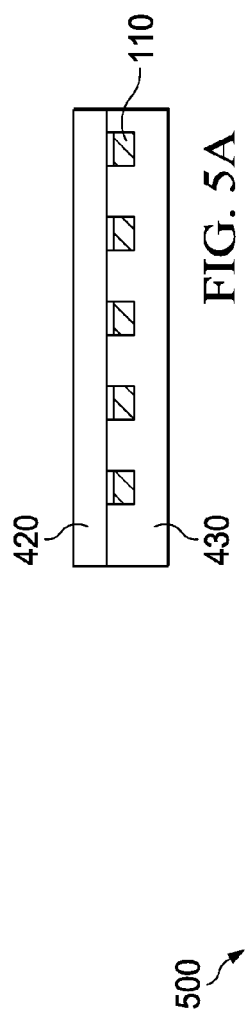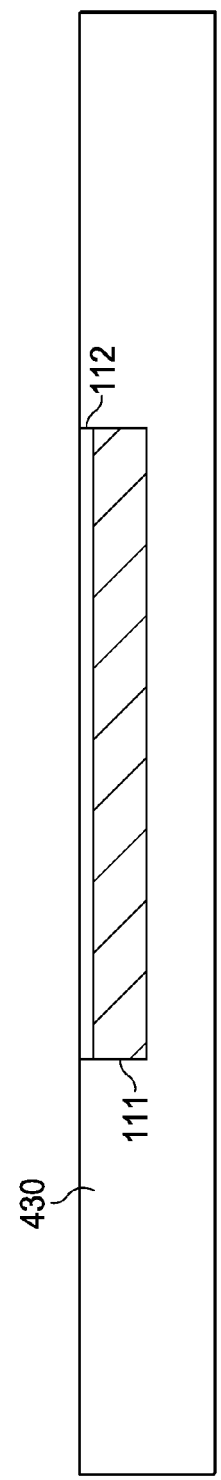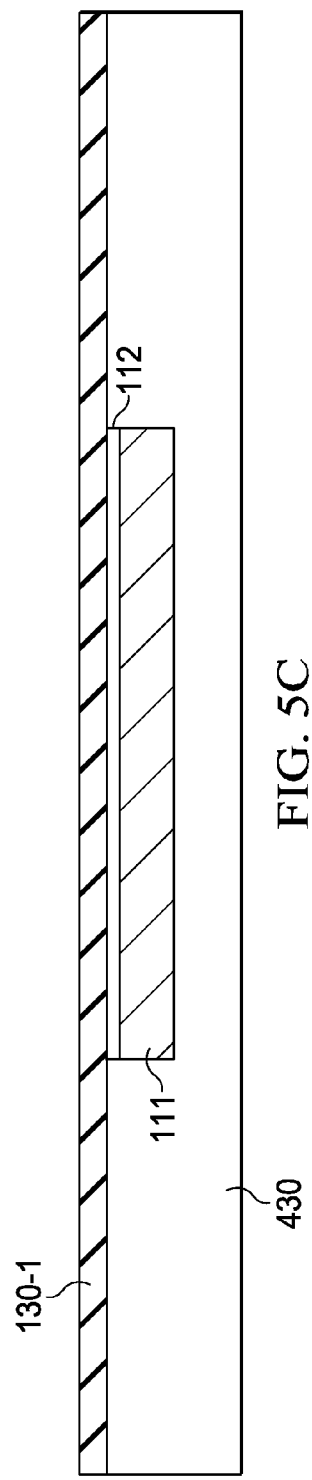

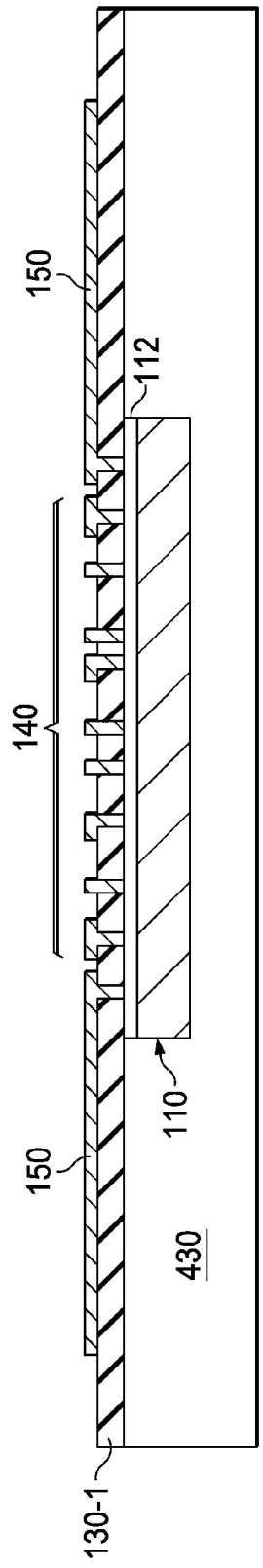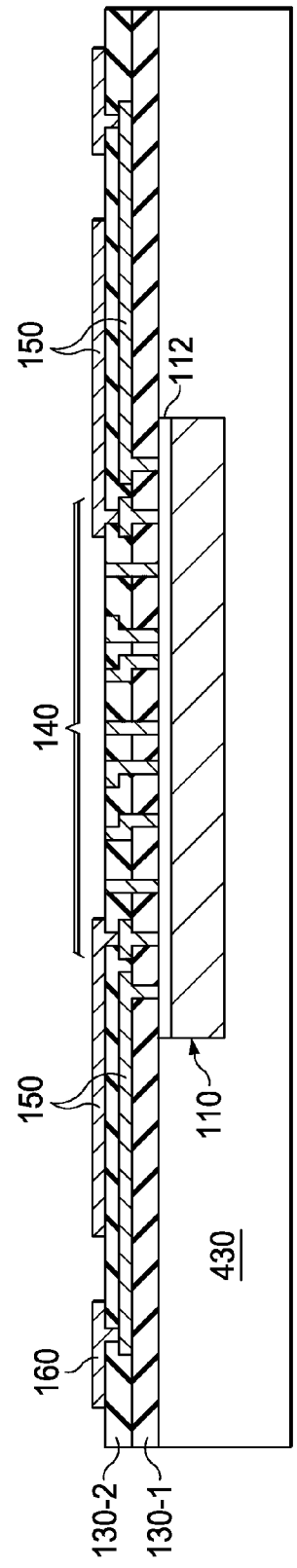

LOW-COST 3D FACE-TO-FACE OUT ASSEMBLY

CROSS-REFERENCE TO RELATED APPLICATION

This application claims the benefit of U.S. Provisional Application Ser. No. 61/377,171, filed by John Osenbach on 26 Aug. 2010, entitled "Low-Cost 3D Face-to-Face Fan Out (F2FFO) Assembly," commonly assigned with this application and incorporated herein by reference.

TECHNICAL FIELD

This application is directed, in general, to a semiconductor device and, more specifically, to integration of multiple semiconductor device substrates.

BACKGROUND

Some high density electronic packaging schemes integrate multiple electronic device dice in a single, stacked arrangement. Such multichip devices may significantly reduce space used on a circuit board by the stacked devices. However, such tight integration of the dice may result in a higher operating temperature, which may reduce the life and/or performance of the stacked devices.

SUMMARY

One aspect provides an electronic that includes first and second electronic device dice. The first electronic device die is embedded within a resin layer. A dielectric layer is located over the device die and the resin layer. First interconnects within the dielectric layer connect a first subset of electrical contacts on the first electronic device to corresponding terminals at a surface of the dielectric that are located over the first electronic device. Second interconnects within the dielectric layer connect a second subset of electrical contacts on the first electronic device to corresponding bump pads at a surface of the dielectric that are located over the resin layer.

Another aspect provides a method of forming an electronic device. A first electronic device die is embedded within a resin layer. A dielectric layer is located over the device die and the resin layer. First interconnects are formed within the dielectric layer, thereby connecting a first subset of electrical contacts on the first electronic device to corresponding terminals at a surface of the dielectric that are located over the first electronic device. Second interconnects are formed within the dielectric layer that connect a second subset of electrical contacts on the first electronic device to corresponding bump pads at a surface of the dielectric that are located over the resin layer.

BRIEF DESCRIPTION

Reference is now made to the following descriptions taken in conjunction with the accompanying drawings, in which:

FIGS. 1A and 1B respectively illustrate a section and plan view of an electronic device according to one embodiment, wherein the electronic deice includes first and second semiconductor dice connected in a 3D stacked configuration;

FIG. 2 illustrates structural aspects of a single electronic device die;

FIGS. 5A-5L illustrate steps in the formation of an electronic device, e.g. the device of FIG. 1, including electrically connecting a first semiconductor die to a second semiconductor die in a 3D stacked configuration.

DETAILED DESCRIPTION

Figure 1B:
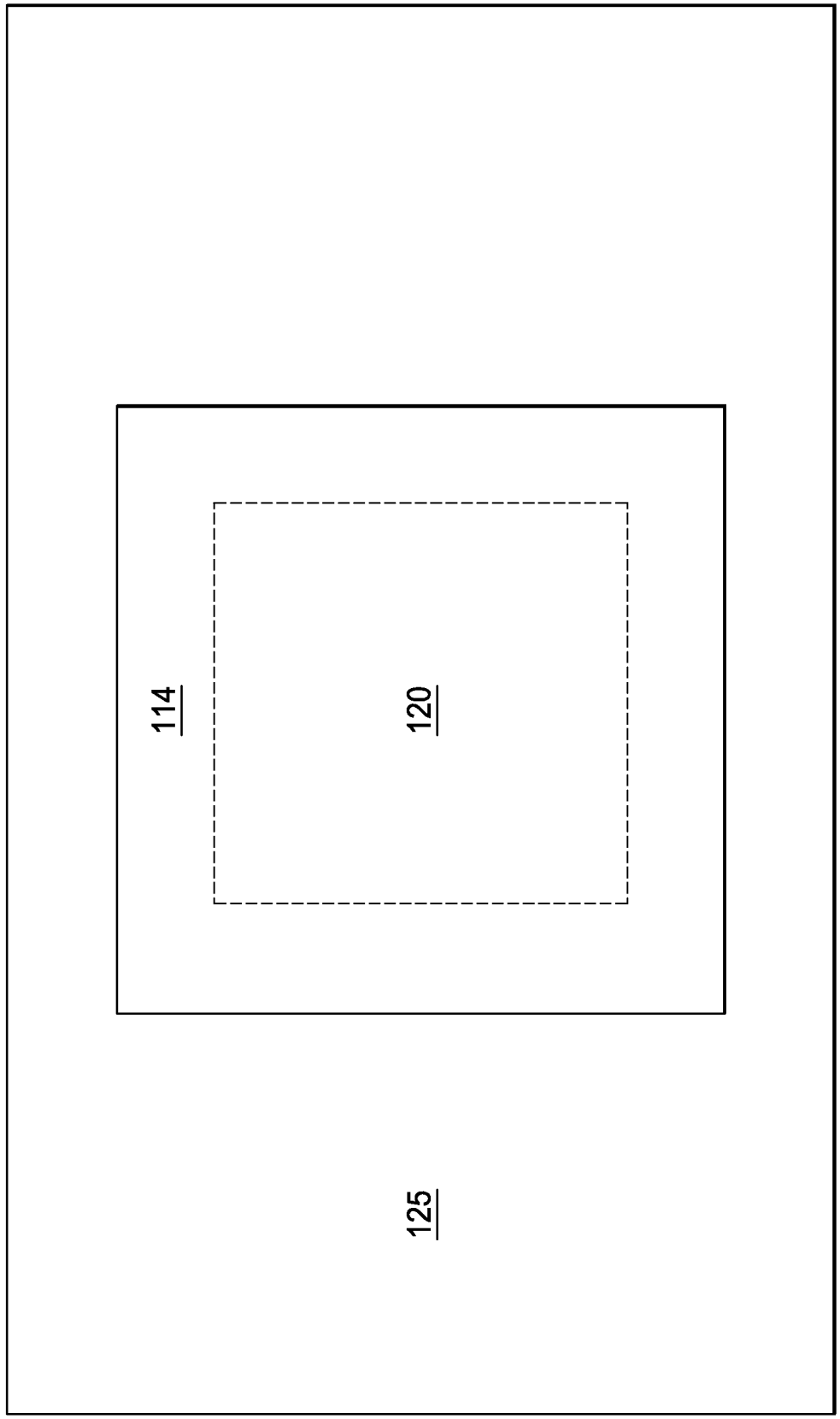

Turning to FIG. 1A, an electrical device 100 is illustrated according to one embodiment. The device 100 includes a first electronic device die 110 and a second electronic device die 120. The dice 110, 120 each may be any conventional or novel electronic device formed on a semiconductor substrate, e.g. an integrated circuit. The dice 110, 120 may each be one of several such devices formed on a semiconductor wafer and separated, e.g. by dicing. The dice 110, 120 are oriented such that active surfaces 112, 122 (described below) face each other. This configuration is referred to herein as "face-to-face".

FIG. 2 illustrates structural aspects of the die 110 in greater detail. The die 110 includes a bulk semiconductor portion 111 and the active surface 112. The bulk semiconductor portion 111 is the portion of a semiconductor substrate on which the die 110 is formed that has not been substantially altered by process steps used to form the active surface 112. The active surface 112 includes various electronic components, e.g. transistors, resistors and capacitors in an integrated circuit configured to perform one or more designated functions. Electrical communication with the integrated circuit is made via terminals 113, e.g. metal pads. The bulk semiconductor portion 111 has a surface 114 that is referenced for later use in this description. The die 120 may provide a different function than the die 110, but includes similar general features. Thus, referring back to FIG. 1A, the die 120 includes a bulk semiconductor portion 121, an active surface 122, electrical contacts 123 and a surface 124 of the bulk semiconductor portion 121.

Again referring to FIG. 1A, the die 110 is embedded within a resin layer 125. The resin layer 125 may be, e.g. a package resin or molding compound, of which there are numerous commercially available types. In various embodiments this material preferably has a thermal expansion coefficient (TEC) within a range of about 3 ppm/° C. and about 15 ppm/° C., and more preferably within a range from about 5 ppm/° C. and about 12 ppm/° C. However, the TEC is not limited to any particular value. The resin layer 125 mechanically supports the device dice 110, 120 and provides additional surface area adjacent to the active surface 112. As described further below, the resin layer 125 may be formed around the device die 110 after the device die 110 is separated from other instances of the device die 110.

FIG. 1B shows in plan view the surface 114 surrounded by the resin layer 125. This view is illustrative of an embodiment in which the surface 114 is exposed and about coplanar with the surface of the resin layer 125. As described further below, this configuration may be desirable in some embodiments for enhanced removal of heat from the die 110. However, embodiments in which the resin layer covers the surface 114 are expressly included within the scope of the disclosure and the claims.

A dielectric layer 130 is located between the active surfaces 112, 122 and extends over the surface of the resin layer 125. As described further below the dielectric layer 130 may include two or more sublayers of dielectric material, e.g. the sublayers 130-1, 130-2, 130-3, formed in separate fabrication steps. The dielectric layer 130 may comprise an organic or inorganic dielectric material suitable for semiconductor processing, such as by a spin-on or vapor deposition process. Examples of suitable materials include without limitation benzocyclobutene (BCB), SiLK™, a spin-on-glass (SOG), one or more of various polyimides, or poly(tetrafluoroethylene) (PTFE).

First interconnects 140 and second interconnects 150 are located within the dielectric layer 130. The first interconnects 140 are located between the first and second device dice 110, 120. In various embodiments the first interconnects 140 have metal pillar portions 141, e.g. vertical conductors that are about cylindrical and intersect the surface of the dielectric layer 130. The surface of a pillar portion 141 may act as a terminal for connecting to a corresponding one of the terminals 113. The first interconnects 140 may function to electrically connect the terminals 113 to the contacts 123 by way of the pillar portions 141 (see FIGS. 5F and 5G).

The second interconnects 150 are located at least partially outside the portion of the dielectric layer 130 between the first and second device dice 110, 120. The second interconnects 150 may therefore also be located over the resin layer 125. In the embodiment of FIG. 1A, the second interconnects 150 run between a subset of the electrical contacts 113 and bump pads 160 located over the resin layer 125. The second interconnects 150 may therefore serve as fan-out interconnects.

The first interconnects 140 may be formed from any suitable conductor, e.g. Cu, Al or Ag-filled epoxy. These interconnects may includes the pillar portions 141 which in some embodiments extend to the pads 113. In some embodiments some of the first interconnects 140 includes a portion that runs about parallel to the die 110. The pillars may have a pitch of about 20 μm to about 100 μm, with a corresponding diameter at the surface of the dielectric layer 130 being within a range of about 5 μm to about 40 μm, with about 20 μm being preferred in some embodiments. The exposed surface area of the pillar portions 141 may be within a range of about 5 μm$^2$ to about 1250 μm$^2$. The height of the interconnects 140 is determined in part by the thickness of the dielectric layer 130, which in turn is determined in part by the number of sublayers and the thickness of the interconnects 150. In various embodiments the preferred height of the interconnects 140 is about 20 μm.

In various embodiments the thickness of the interconnects 150 is within a range of about 0.25 μm to about 55 μm, with about 5-10 μm being preferred in some embodiments. The thickness of the sublayers 130-2, 130-3 is sufficient to include the metal interconnect within that layer and insulate that interconnect from a vertically neighboring interconnect. The sublayer thickness may be within a range from about 0.5 μm to about 30 μm with about 5 μm being preferred in some embodiments. Including the initial sublayer 130-1, the dielectric layer 130 may include, e.g. 2n+1 sublayers, where n=1, 2, 3, Thus, when the interconnects 150 include four metal levels, the thickness of the dielectric layer 130 may range from about 2.25 μm to about 500 μm. The height of the interconnects 140 will also be within a range of 2.25 μm to about 500 μm for this example embodiment.

The device 100 also includes solder bumps 180 and microbumps 190. The solder bumps 180 and the microbumps 190 are distinguished by size and location. The solder bumps 180 are located on the bump pads 160, e.g. over the resin layer 125, while the microbumps 190 are located between the device dice 110, 120. A conventional underfill 195 may be used between the dice 110 and 120 to mechanically stabilize the assembly and protect the microbumps 190 from moisture and contamination form the ambient.

In various embodiments the solder bumps 180 have a diameter of at least about 125 μm, with the diameter in some embodiments being within a range from about 125 μm to about 250 μm. In various embodiments the microbumps 190 have a diameter less than about 100 μm, with the diameter in some embodiments being within a range from about 10 μm to about 100 μm. In various embodiments the solder bumps 180 and the microbumps 190 are formed from a suitable material such as a lead-free solder alloy, and may further include Cu, e.g. a SAC alloy. The solder may be, e.g. electroplated onto the bump pads 160 and the pillar portions 141.

The second device die 120 is conductively coupled to the first device die 110 by way of the microbumps 190. Because the dice 110, 120 are face-to-face, the signal paths between the dice 110, 120 are advantageously short relative to various conventional configurations, such as implementations that use through-hole vias (THVs). In various embodiments, as described above, the signal path length may be within a range from about 0.5 μm to about 50 μm. Thus, the resistance and the capacitance of the signals paths may be kept relatively low, and the signal paths are expected to have a higher bandwidth to support higher-speed signals.

Figure 3:
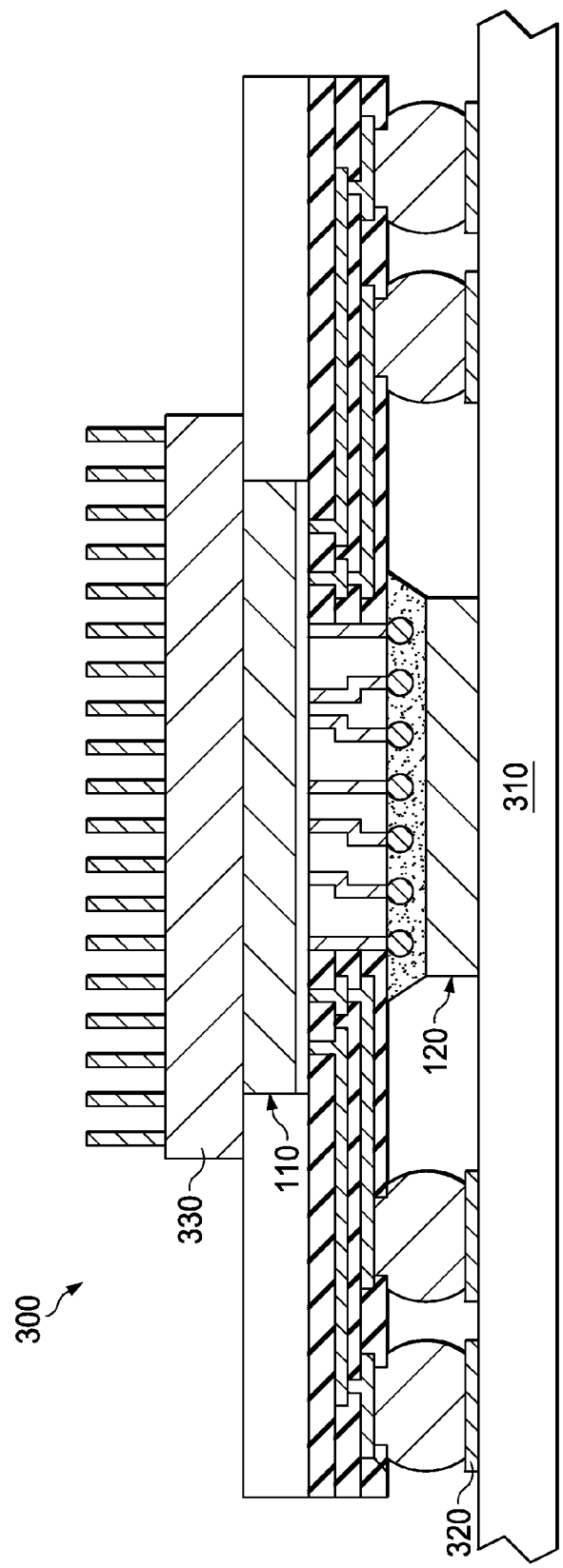
FIG. 3 illustrates a 3D stacked electronic device, e.g. the electronic device of FIG. 1 mounted to a substrate and including a heat sink.

Turning to FIG. 3, an electronic assembly 300 is illustrated according to one embodiment. The device 100 is mounted to an electronic system substrate 310, e.g. a circuit board, multi-chip module, or similar substrate. The solder bumps 180 are connected to bump pads 320 on the substrate 310, such as by a solder reflow process. In one embodiment the die 120 is in thermal contact with the substrate 310, as illustrated. Herein and in the claims thermal contact includes direct contact between a surface of the die 120 and the substrate 310, and contact through a thermally conductive substance such as thermal grease or a thermal pad. Thus, the substrate 310 may act as a heat sink to the die 120. The substrate 310 may includes metal features or a thermo-electric cooler to increase heat flow from the die 120. In some embodiments thermal contact between the die 120 and the substrate 310 results in intimate thermal contact, defined for the purposes of this discussion and the claims as a thermal resistance of less than about 0.5° C./W.

The assembly 300 also includes a heat sink 330. The heat sink 330 is in thermal contact with the die 110. Again thermal contact may include an intervening layer of thermal grease or a thermal pad. The heat sink 330 is any thermally conductive entity that is commonly understood to be configurable to conduct heat from the die 120. For example, the heat sink 330 may comprise a metal block, radiant fins (as illustrated), a thermoelectric cooler, a vapor chamber, heat pipe, or liquid coolant.

By virtue of the substrate 310 and the heat sink 330 the assembly 300 may be cooled from two directions simultaneously, thus being cooled more effectively that would be the case of a conventional 3-D stacked electronic device. For example, in a typical conventional 3-D stacked electronic device, heat from one or the other of the dice 110, 120 would typically flow vertically with respect to an underlying substrate to a single heat sink. The thermal resistance of such an arrangement is expected to be higher than for embodiments exemplified by the assembly 300. Thus the temperature of a conventional 3-D stacked device is expected to be higher than is the case of heat extraction from both of the dice 110, 120. The lower temperature operation enabled by embodiments exemplified by the assembly 300 is expected to result in, e.g.

fewer data errors and greater operating lifetime than would be the case for conventional 3-D configurations.

Figure 4C:
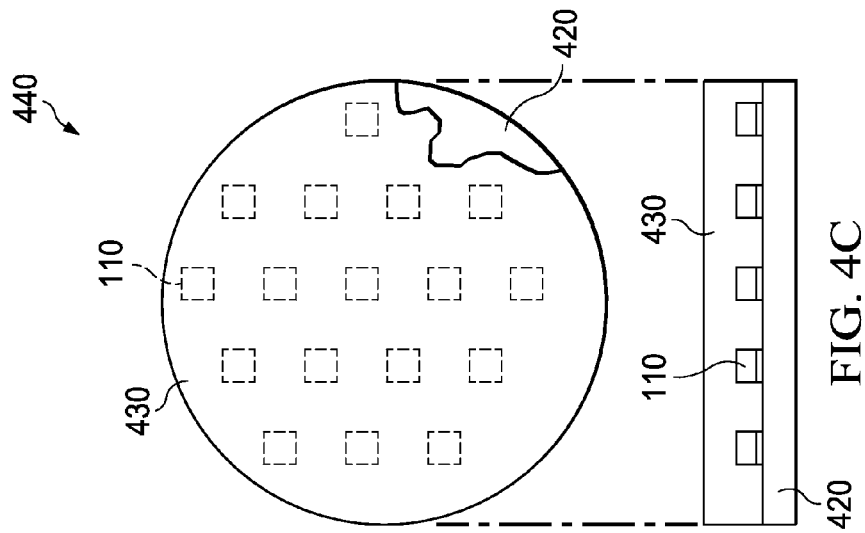
FIGS. 4A-4C illustrate steps in the formation of an electronic device, e.g. the device of FIG. 1, including forming a secondary substrate for further processing known good dice.
Figure 4B:
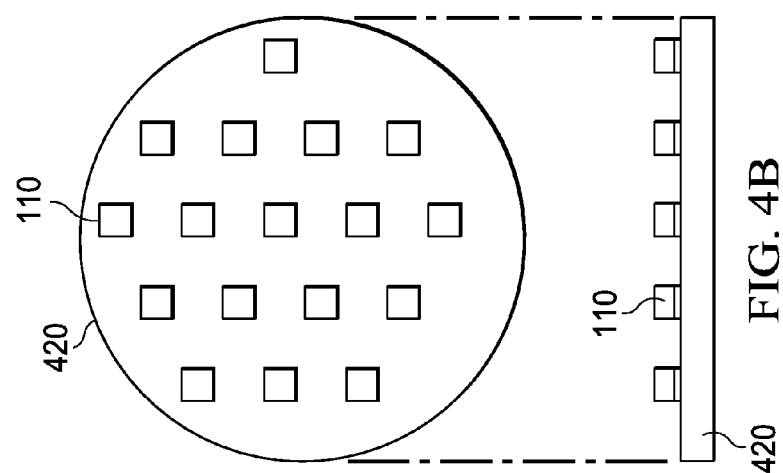
Figure 4A:
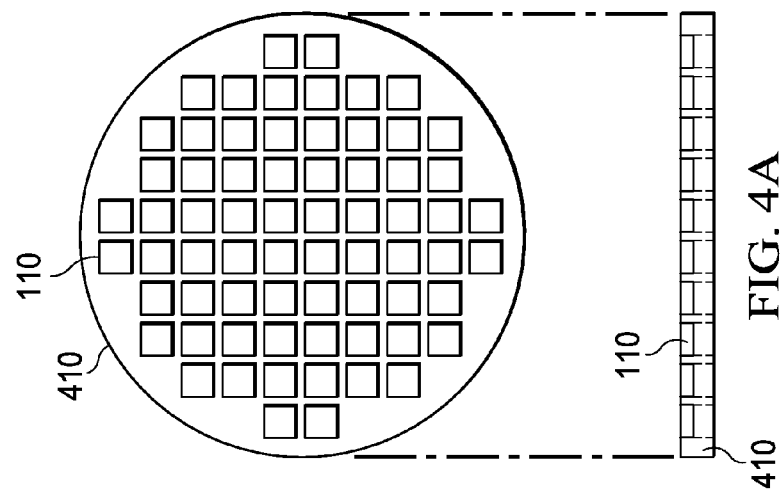

FIGS. 4A-4C illustrate initial steps in one embodiment of a method of forming a 3-D stacked electronic device, e.g. the assembly 300. FIG. 4A illustrates a production wafer 410 having a number of the dice 110 formed thereon. The dice 110 are typically nominally identical instances of a particular electronic device design. The dice 110 are typically tested at the end of the production line, with functional dice designated know good die (KGD) for packaging and further test. The dice 110 are singulated for further processing.

In FIG. 4B, the known good dice 110 have been inverted and placed on a handle wafer 420. The dice 110 are placed at a subset of an array of locations at which various semiconductor tools may operate to further process the die 110. For example, a photolithography stepper used to pattern layers in a later process step may be operable to expose the die 110 located at specific locations on the handle wafer 420.

In one example, the array described by the dice 110 on the wafer 410 serves a template for placing the dice on the handle wafer 420. However, the dice 110 are placed on the handle wafer 420 so that no two neighboring locations of the original array are simultaneously occupied. Thus, the dice 110 are separated by unoccupied area of the wafer 410 that is about equal to the width of the die 110.

In FIG. 4C the dice 110 have been coated with a layer 430 of thermoset resin, mold compound or similar material by e.g., spin-coating to form an assembly 440. The layer 430 is processed, e.g. cured, to produce a secondary substrate that is capable of providing mechanical support for the dice 110 in subsequent processing steps.

FIGS. 5A-5K illustrate one embodiment of steps in a method 500 for forming a 3D stacked electronic device after forming the resin layer 430. FIG. 4A shows the assembly 440 inverted, so that the resin layer 430 supports the dice 110 and the handle wafer 420. Subsequent process steps focus on a single die 110. In various embodiments the dice 110 are processed simultaneously in standard semiconductor processing tools.

In FIG. 5B the handle wafer 420 has been removed to expose the active surface 112 of the die 110. The dielectric sublayer 130-1 is formed over the die 110, yielding the assembly illustrated in FIG. 5C. The dielectric layer 130-1 may comprise any suitable dielectric, such as the previously-described examples.

In FIG. 5D a first level of interconnections 140 and interconnects 150 have been formed. The interconnects 140, 150 may be formed using various patterning and metallization steps known to those skilled in the semiconductor arts, including photolithography, wet and/or dry etch, metal seed-layer deposition and metal PVD and/or electroplating. Because the dice 110 are positioned at the array locations as previously described (see FIG. 3C), lithography steps may be performed in a standard stepper.

In FIG. 5E the second dielectric sublayer 130-2 and a second level of interconnections 140, 150 have been formed, again with any appropriate combination of the aforementioned processing steps. For the purposes of illustration two interconnect layers are shown, but embodiments of the device 100 are not limited to any particular number of levels. Portions of the top level of the interconnects may serve as the bump pads 160.

Figure 5F:
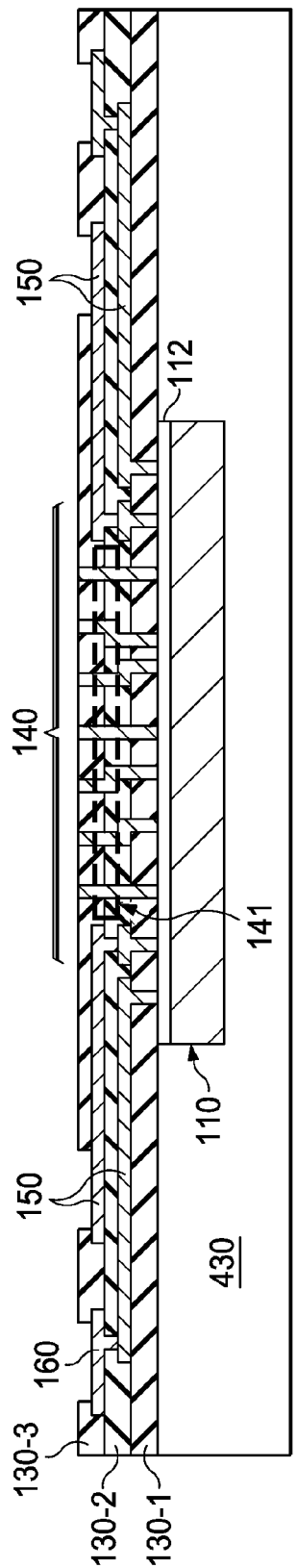

In FIG. 5F the third dielectric sublayer 130-3 has been deposited and patterned to produce openings to the bump pads 160. The interconnects 140 have been extended to the surface of the dielectric sublayer 130-3 by the pillar portion 141.

Figure 5G:
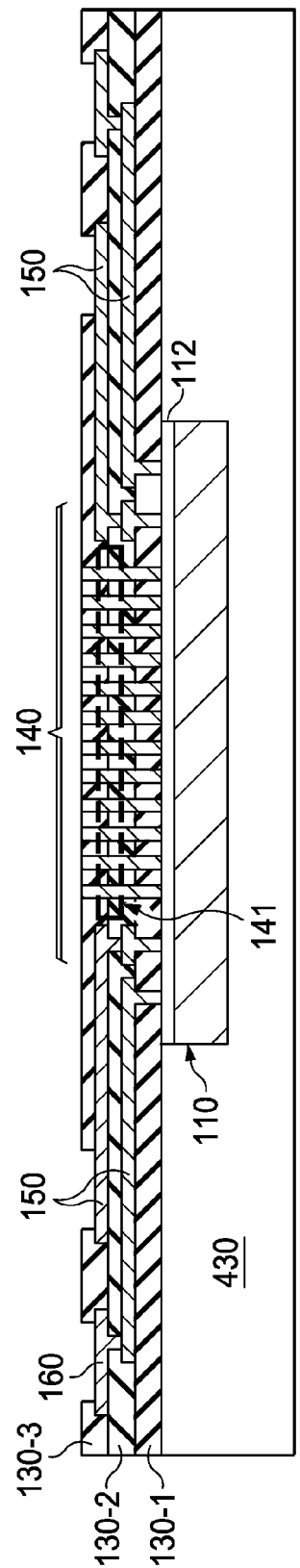

FIG. 5G illustrates an embodiment in which the interconnects 140 are formed as uniformly vertical pillars. In contrast the embodiment of FIG. 5F includes within the interconnects 140 lateral current paths, e.g. about parallel to the active surface 113. In the embodiment of FIG. 5G, the interconnects 140 may be formed as a uniform array of pillars that present a corresponding uniform array of microbump contacts at the surface of the dielectric level 130-3. In some embodiments the interconnects 140 as illustrated in FIG. 5G are formed after the sublayer 130-3 is formed. For example, a patterning process may create openings within the dielectric layer 130 at the desired locations of the interconnects 140. The openings may be filled with metal by, e.g. electroplating or filling with metal-loaded epoxy.

Figure 5H:
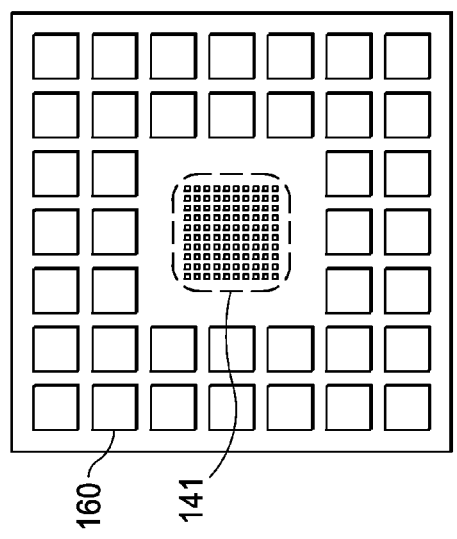

FIG. 5H illustrates a plan view of the device 100 showing the exposed pillar portions 141 and the bump pads 160 in one embodiment. The interconnects 140 are located to provide electrical connections to a corresponding set of I/O connections on the die 120, e.g. the contacts 123. The bump pads 160 are located to provide electrical connections to a corresponding set of terminals, e.g. the bump pads 320 (FIG. 3).

The bump pads 160 may be, e.g. circles or squares, with a surface area substantially larger than the cross-sectional area of the interconnects 140. For example, a bump pad 160 may have a surface area of about 2.5E3 $\mu m^2$ to about 1E4 $\mu m^2$, while the exposed surface of the pillar portion may have a surface area on the order of about 20 $\mu m^2$ to about 1250 $\mu m^2$.

Figure 5I:
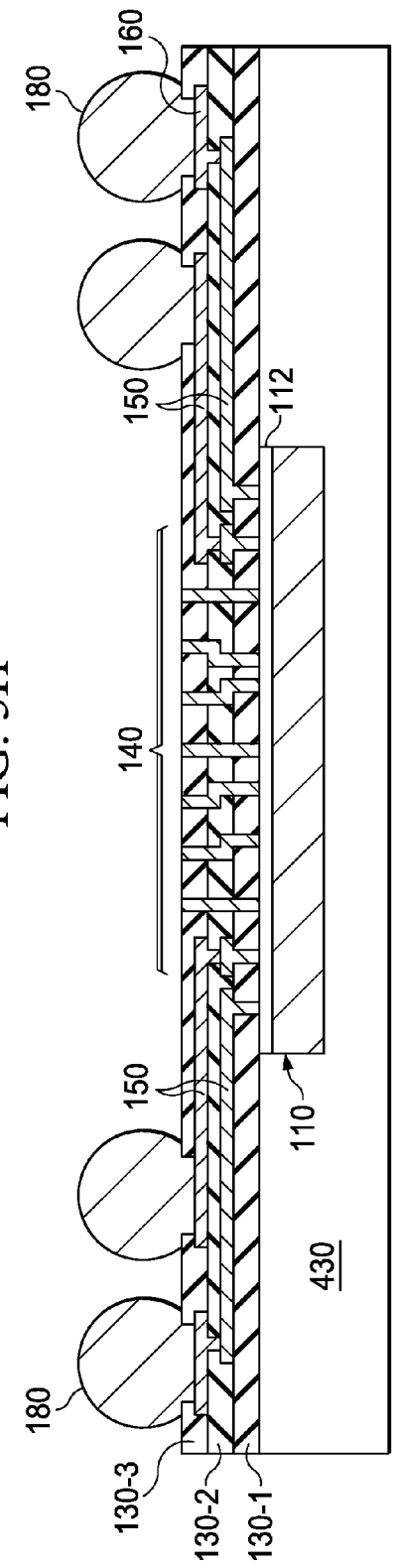

FIG. 5I illustrates the device 100 after the solder bumps 180 are formed on the bump pads 160 and microbumps 190 are formed on the interconnects 140. The solder bumps 180 and the microbumps 190 may be formed from a Pb-free alloy such as SnAg or SnAgCu, but embodiments are not limited to the use of Pb-free alloys. The solder bumps 180 may be formed from a first electroplating process, and the microbumps 190 may be formed from a second electroplating process. The alloys used for the solder bumps 180 and the microbumps 190 need not be the same. The solder bumps 180 and the microbumps 190 may optionally be reflowed after electroplating.

Figure 5J:
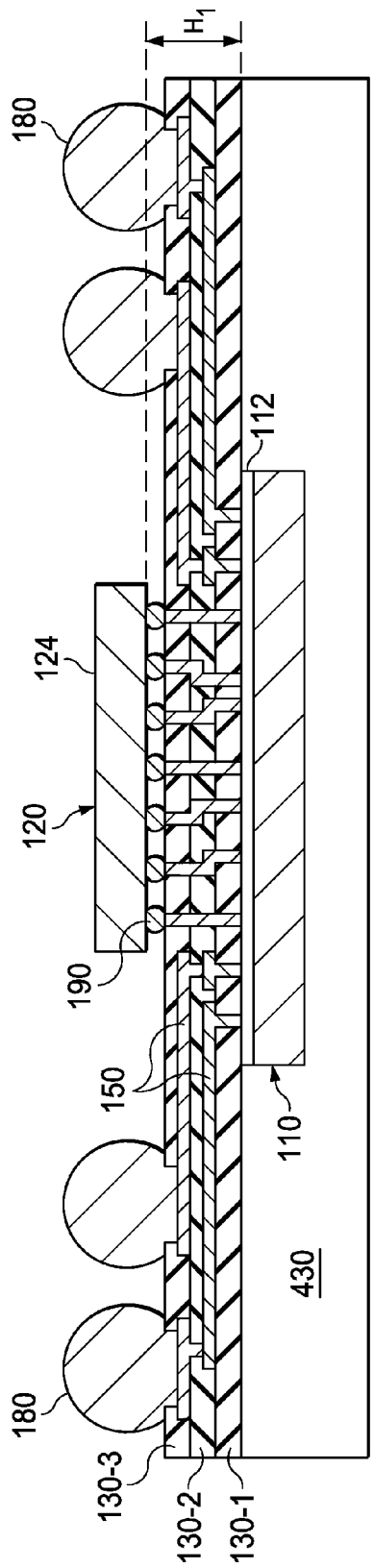

In FIG. 5J the die 120 has been attached to the interconnects 140 by, e.g. a solder reflow process. The connection places the die 120 in electrical communication with the die 110 via the interconnects 140. The die 120 is located at a height $H_1$ above the die 110. The distance $H_1$ is determined in part by the number of dielectric sublayers 130-1, 130-2, 130-3, and in part by the height of the microbumps 190. For example, if each of the sublayers 130-1, 130-2, 130-3 is about 0.5 $\mu m$ thick and the microbumps 190 have a diameter of about 20 $\mu m$ then $H_1$ may be about 21.5 $\mu m$. Thus in this example embodiment the signal paths between the dice 110, 120 may also be no greater than about 21.5 $\mu m$, providing a low resistance and capacitance of the signals paths between the dice 110, 120.

Figure 5K:
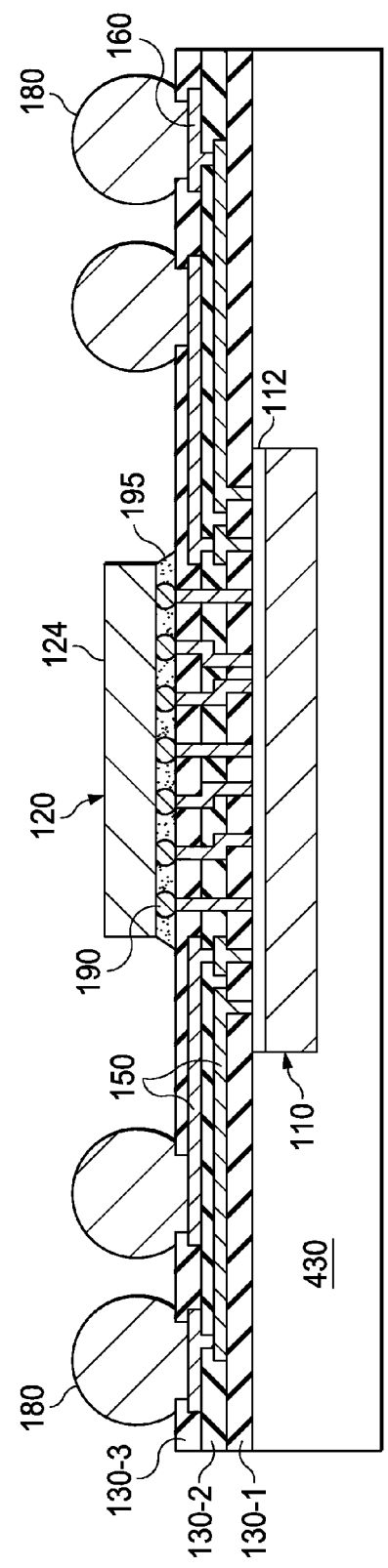

In FIG. 5K the underfill 195 has been placed between the die 110 and the die 120. While optional, the underfill 195 is often desirable to mechanically stabilize the connection and prevent intrusion by moisture. The underfill may be a conventional underfill material, and applied in a conventional manner.

Figure 5L:
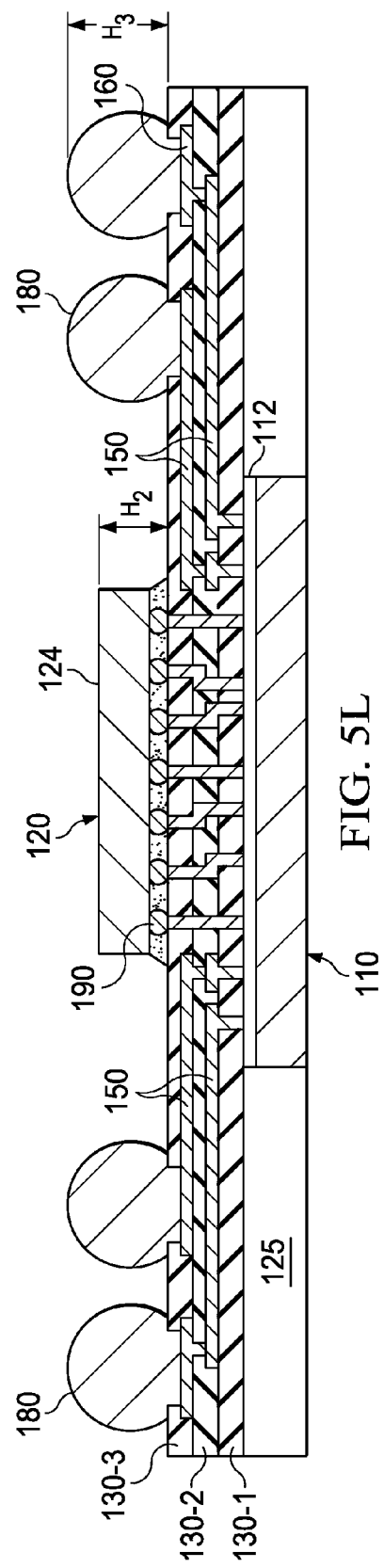

In FIG. 5L the resin layer 430 has been thinned to form the resin layer 125 and to expose the surface 114 of the die 110. Thinning may be performed, e.g. by conventional wafer back-grind tool. The thinning makes the surface 114 available for the direct extraction of heat from the die 110 without any intervening resin material. Thus the die 110 may be operated at a cooler temperature that when the resin layer 430 is present.

The device 100 as illustrated in FIG. 5L may be mounted to a suitably configured substrate, e.g. the substrate 310, by another reflow process. In various embodiments a height $H_2$ of the surface 124 of the die 120 above the dielectric layer 130 is less than a height $H_3$ of the top of the solder bumps 180 above the dielectric layer 130. Such a configuration is expected to place the surface 124 in contact with the substrate 310 when the device 100 is mounted thereto. However, if the height $H_3$ is too large, the die 120 may float above the substrate 310 without the surface 124 contacting the substrate 310. To ensure contact between the surface 124 and substrate 310, $H_3$ may be limited to being no greater than about 20% larger than $H_2$. This limit is expected to provide sufficient solder to provide a reliable solder connection to the substrate 310 while limiting the tendency of the device 100 to float on the solder bumps 180. Alternatively or in addition to limiting $H_3$, pressure may be applied to the device 100 during the reflow process to ensure contact between the surface 124 and the substrate 310.

Figure 6:
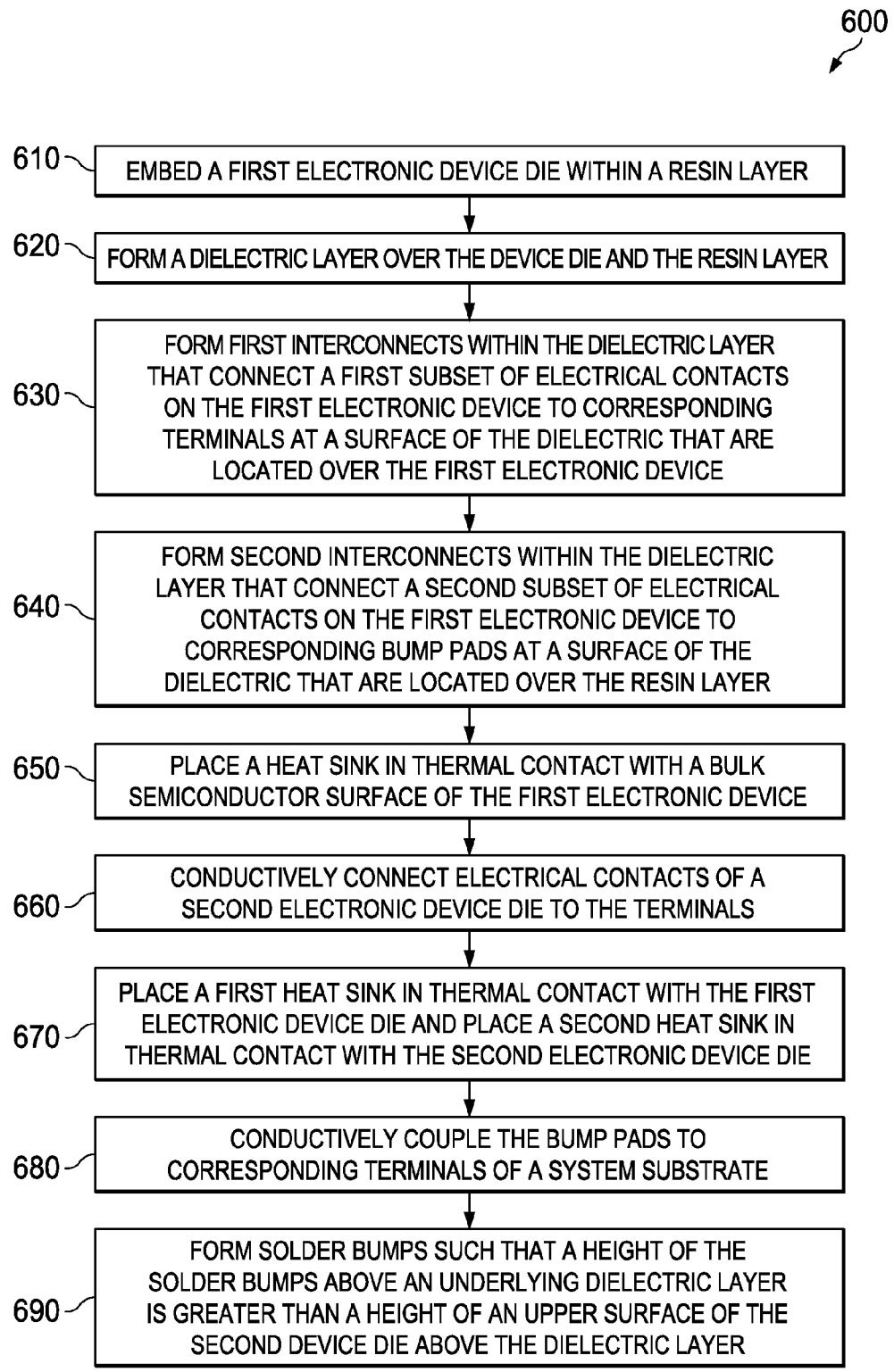
FIG. 6 presents a method of forming an electronic device, e.g. the device of FIGS. 1A and 1B, according to one embodiment.

Turning now to FIG. 6, a method 600 is presented of forming an electronic device according to one embodiment. The method 600 is described without limitation by referring to the various embodiments described herein, e.g., embodiments of FIGS. 1-5. In various embodiments the steps of the method 600 may not be performed, or may be performed in an order other than the illustrated order.

In a step 610 a first electronic device die, e.g. the die 110, is embedded within a resin layer, e.g. the resin layer 125. In a step 620 a dielectric layer, e.g. the dielectric layer 130, is formed over the device die and the resin layer.

In a step 630 first interconnects, e.g. the interconnects 140, are formed within the dielectric layer. The first interconnects connect a first subset of electrical terminals on the first electronic device die to corresponding interconnect pillars, e.g. the pillar 141, at a surface of the dielectric that are located over the first electronic device.

In a step 640 second interconnects, e.g. the interconnects 150, are formed within the dielectric layer. The second interconnects connect a second subset of electrical contacts on the first electronic device die to corresponding bump pads at a surface of the dielectric that are located over the resin layer.

In a step 650 a heat sink, e.g. the heat sink 330, is placed in thermal contact with the first electronic device die.

In a step 660 terminals of a second electronic device die, e.g. the contacts 123 of the die 120, are connected to the interconnect pillars.

In a step 670 a first heat sink, e.g. the electronic system substrate 310, is placed in thermal contact with the second electronic device die, and a second heat sink, e.g. the heat sink 330, is placed in thermal contact with the first electronic device die.

In a step 680 bump pads, e.g. the bump pads 160, are conductively coupled to corresponding terminals of a system substrate, e.g. the bump pads 320 of the substrate 310.

In a step 690 solder bumps, e.g. the solder bumps 180, are formed such that a height of the solder bump above an underlying dielectric layer is greater than a height of an upper surface of the second device die above the dielectric layer.

Those skilled in the art to which this application relates will appreciate that other and further additions, deletions, substitutions and modifications may be made to the described embodiments.

What is claimed is:

1. An electronic device, comprising:
a resin layer;
a first electronic device die having an active surface and an opposite surface of a bulk semiconductor layer, wherein said first electronic device die is embedded within said resin layer, and said active surface is not covered by said resin layer;
a second electronic device die having an second active surface and an opposite second surface of another bulk semiconductor layer, wherein said active surface and said second active surface face each other;
a dielectric layer located over said active surface of said first electronic device die and said resin layer;
first interconnects within said dielectric layer that connect a first subset of electrical contacts on said active surface of said first electronic device die to corresponding terminals at a surface within a portion of said dielectric layer laying in between said first electronic device die and said second electronic device die, wherein said corresponding terminals are located over said first electronic device die, are located between said first and said second electronic device dies and, are part of electrical signal paths between said active surface said second active surface; and
second interconnects within said dielectric layer that connect a second subset of electrical contacts on said active surface of said first electronic device die to corresponding bump pads at a surface of said dielectric layer located over said resin layer and wherein said corresponding bump pads are located outside of said portion of said dielectric layer.

2. The electronic device of claim 1, wherein said electrical signal paths between said active surface and said second active surface are less than about 50 μm.

3. The electronic device of claim 1, wherein said opposite surface of said bulk semiconductor surface of said electronic device die is not covered by said resin layer and is about coplanar with a side of said resin layer.

4. The electronic device of claim 1, wherein said second opposite surface of said second electronic device die contacts one or more metal heat transfer features located on an electronic system substrate of said electronic device.

5. The electronic device of claim 1, wherein said dielectric layer comprises BCB or polyimide.

6. The electronic device of claim 1, wherein said second active surface of said second electronic device die have a third subset of electrical contacts that are electrically connected to said corresponding terminals at said surface within said portion of said dielectric layer.

7. The electronic device of claim 1, further comprising an electronic system substrate, wherein said corresponding bump pads are electrically connected to terminals on said electronic system substrate by solder bumps.

8. The electronic device of claim 1, wherein said second opposite surface of said second electronic device die is in thermal contact with an electronic system substrate of said electronic device.

9. The electronic device of claim 1, wherein said opposite surface of said first electronic device die is not covered by said resin layer and is in thermal contact with a heat sink of said electronic device.

10. The electronic device of claim 9, wherein said second opposite surface of said second electronic device die is in thermal contact with second heat sink of said electronic device.

11. A method of forming an electronic device, comprising:
embedding a first electronic device die having an active surface and an opposite surface of a bulk semiconductor layer within a resin layer, wherein said active surface is not covered by said resin layer;

forming a dielectric layer over said active surface of said first electronic device die and said resin layer;

forming first interconnects within said dielectric layer that connect a first subset of electrical contacts on said active surface of said first electronic device die to corresponding terminals at a surface within a portion of said dielectric layer, wherein said corresponding terminals are located over said first electronic device die;

forming second interconnects within said dielectric layer that connect a second subset of electrical contacts on said active surface of said first electronic device die to corresponding bump pads at a surface of said dielectric layer located over said resin layer;

providing a second electronic device die having an second active surface and an opposite second surface of another bulk semiconductor layer, wherein said active surface and said second active surface face each other; and connecting a third subset of electrical contacts of said second electronic device die to said corresponding terminals at said surface within said portion of said dielectric layer, wherein:

said portion of said dielectric layer lies in between said first electronic device die and said second electronic device die, said corresponding terminals are located between said first and said second electronic device dies and are part of electrical signal paths between said active surface said second active surface, and said corresponding bump pads are located outside of said portion of said dielectric layer.

12. The method of claim 11, wherein said electrical signal paths between said active side said second active side are less than about 50 μm.

13. The method of claim 11, wherein said dielectric layer comprises BCB or polyimide.

14. The method of claim 11, wherein said opposite surface of said first electronic device die is not covered by said resin layer and is about coplanar with a surface of said resin layer.

15. The method of claim 11, further including placing one or more metal heat transfer features located on an electronic system substrate of said electronic device in thermal contact with said second opposite surface of said second electronic device die.

16. The method of claim 11, wherein connecting said third subset of electrical contacts of said second electronic device die to said corresponding terminals further includes coupling micro solder bumps to said third subset of electrical contacts and to said corresponding terminals.

17. The method of claim 11, further including placing a first heat sink in thermal contact with said opposite surface of said first electronic device die and placing a second heat sink in thermal contact with said second opposite surface of said second electronic device die.

18. The method of claim 11, further including electrically connecting said corresponding bump pads to terminals on an electronic system substrate.

19. The method of claim 11, wherein said second opposite surface of said second electronic device die is in thermal contact with an electronic system substrate of said electronic device.

20. The method of claim 11, further including forming solder bumps on said corresponding bump pads such that a height of said solder bumps above said dielectric layer is greater than a height of an upper surface of said second electronic device die above said dielectric layer.

* * * * *